US011088704B2

(12) United States Patent
Chen et al.

(10) Patent No.: US 11,088,704 B2
(45) Date of Patent: Aug. 10, 2021

(54) ANALOG-TO-DIGITAL CONVERTER (71) Applicant: REALTEK SEMICONDUCTOR CORPORATION, Hsinchu (TW)

(72) Inventors: Chih-Lung Chen, Hsinchu County (TW); Shih-Hsiung Huang, Miaoli County (TW)

(73) Assignee: REALTEK SEMICONDUCTOR CORPORATE, Hsinchu (TW)

( * ) Notice: Subject to any disclaimer, the term of this patent is extended or adjusted under 35 U.S.C. 154(b) by 0 days.

(21) Appl. No.: 16/896,409

(22) Filed: Jun. 9, 2020

(65) Prior Publication Data
US 2021/0075439 A1 Mar. 11, 2021

(30) Foreign Application Priority Data
Sep. 9, 2019 (TW) ................. 108132351

(51) Int. Cl.
*H03M 3/00* (2006.01)
(52) U.S. Cl.
CPC ........... *H03M 3/464* (2013.01); *H03M 3/426* (2013.01); *H03M 3/462* (2013.01); *H03M 3/494* (2013.01)
(58) Field of Classification Search
CPC ...... H03M 3/464; H03M 3/494; H03M 3/426; H03M 3/462; H03M 3/30; H03M 1/12
USPC ........................................ 341/144, 155, 143
See application file for complete search history.

(56) References Cited

U.S. PATENT DOCUMENTS

| 6,064,326 | A | 5/2000 | Krone et al. | |
|---|---|---|---|---|
| 8,228,221 | B2* | 7/2012 | Lai | H03M 3/38 341/143 |
| 9,438,266 | B1 | 9/2016 | Nagaraj et al. | |
| 10,439,633 | B2* | 10/2019 | Breems | H03M 3/37 |
| 10,439,634 | B2* | 10/2019 | Bolatkale | H03M 3/464 |
| 10,630,311 | B1* | 4/2020 | Chen | H03M 3/352 |
| 10,778,244 | B2* | 9/2020 | Chen | H03M 3/50 |
| 2007/0241950 | A1* | 10/2007 | Petilli | H03M 1/0663 341/143 |

(Continued)

OTHER PUBLICATIONS

Qiwei Wang et al., "A Digital Filtering ADC With Programmable Blocker Cancellation for Wireless Receivers", Mar. 2018, pp. 681-691, vol. 53, No. 3, IEEE Journal of Solid-State Circuits.

(Continued)

*Primary Examiner* — Jean B Jeanglaude
(74) *Attorney, Agent, or Firm* — WPAT, PC (57) ABSTRACT

An analog-to-digital converter (ADC) is provided. The ADC receives an analog input signal and generates a digital code. The ADC includes a sigma-delta modulator (SDM), a decimation filter and a detection circuit. The SDM includes a loop filter, a quantizer and a digital-to-analog converter (DAC). The loop filter receives the analog input signal. The quantizer is coupled to the loop filter and quantizes an output of the loop filter to generate a digital output signal. The DAC is coupled to the quantizer and the loop filter. The decimation filter is coupled to the SDM and converts the digital output signal into the digital code. The detection circuit is coupled to the SDM and detects a node voltage of the SDM and generate a control signal. The control signal is utilized to control the loop filter, the quantizer, a feedback path of the SDM and/or a feedforward path of the SDM.

16 Claims, 5 Drawing Sheets

(56) References Cited

U.S. PATENT DOCUMENTS

| 2012/0075132 | A1* | 3/2012 | Lai | H03M 3/38 |
| --- | --- | --- | --- | --- |
| | | | | 341/143 |
| 2014/0077984 | A1* | 3/2014 | Shu | H03M 3/30 |
| | | | | 341/143 |
| 2018/0343013 | A1* | 11/2018 | Breems | H03M 3/496 |
| 2019/0245553 | A1* | 8/2019 | Bolatkale | H03M 3/37 |
| 2020/0106456 | A1* | 4/2020 | Chen | H03M 3/458 |

OTHER PUBLICATIONS

Tzu-Yun Wang et al., "A Bypass-Switching SAR ADC With a Dynamic Proximity Comparator for Biomedical Applications", Jun. 2018, pp. 1743-1754, vol. 53, No. 6, IEEE Journal of Solid-State Circuits.

OA letter of the counterpart TW application (appl. No. 108132351) dated Oct. 15, 2019. Summary of the OA letter: References 1 (US 6064326 A) and 2 (US 9438266 B1) render claims 1 and 9-10 obvious.

\* cited by examiner

ANALOG-TO-DIGITAL CONVERTER

BACKGROUND OF THE INVENTION

1. Field of the Invention

The present invention generally relates to an analog-to-digital converter (ADC), and, more particularly, to a sigma-delta modulator ADC (SDM ADC).

2. Description of Related Art

A sigma-delta modulator (SDM) is a commonly used to implement an ADC. However, the signal applied to the SDM usually has the following characteristics: outside the signal bandwidth of the in-band signal, there are out-of-band signals with magnitudes greater than the in-band signals. This kind of out-of-band signals that interfere with the SDM can be referred to as an image or blocker. Therefore, detecting and suppressing these unwanted out-of-band signals has become an important issue in this technical field.

SUMMARY OF THE INVENTION

In view of the issues of the prior art, an object of the present invention is to provide an ADC that has improved stability, so as to make an improvement to the prior art.

An analog-to-digital converter (ADC) configured to receive an analog input signal and generate a digital code is provided. The ADC includes a sigma-delta modulator (SDM), a decimation filter and a detection circuit. The SDM includes a loop filter, a quantizer and a digital-to-analog converter (DAC). The loop filter is configured to receive the analog input signal. The quantizer is coupled to the loop filter and configured to quantize an output of the loop filter to generate a digital output signal. The DAC is coupled to the quantizer and the loop filter. The decimation filter is coupled to the SDM and configured to convert the digital output signal to the digital code. The detection circuit is coupled to the SDM and configured to detect a node voltage of the SDM and generate a control signal. The control signal is utilized to control the loop filter, the quantizer, a feedback path of the SDM and/or a feedforward path of the SDM.

An analog-to-digital converter (ADC) configured to receive an analog input signal and generate a digital code is provided. The ADC includes a sigma-delta modulator (SDM), a decimation filter, a detection circuit and a control circuit. The SDM includes a loop filter, a quantizer and a digital-to-analog converter (DAC). The loop filter is configured to receive the analog input signal. The quantizer is coupled to the loop filter and configured to quantize an output of the loop filter to generate a digital output signal. The DAC is coupled to the quantizer and the loop filter. The decimation filter is coupled to the SDM and configured to convert the digital output signal to the digital code. The detection circuit is coupled to the SDM and configured to detect a node voltage of the SDM and generate a detection result. The control circuit is coupled to the detection circuit and configured to generate a control signal according to the detection result. The control signal is utilized to control the loop filter, the quantizer, a feedback path of the SDM and/or a feedforward path of the SDM.

The ADC of the present invention uses at least one detection circuit to detect at least one node voltage of the SDM, and adaptively adjusts the ADC according to the detection result(s) to improve the stability of the ADC and reduce power consumption. In comparison with the conventional technology, the ADC of the present invention can detect and suppress unwanted out-of-band signals, thus stabilizing the ADC.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

As used herein, the term "and/or" includes any and all combinations of one or more of the associated listed items. For ease of understanding, similar elements in various figures are designated with the same reference numbers.

Although the terms "first," "second," etc., may be used herein to describe various elements, these elements should not be limited by these terms. These terms used in this way aim to distinguish one element from another. For example, a first element could be termed a second element, and, similarly, a second element could be termed a first element, without departing from the scope of the embodiments.

The disclosure herein includes SDM ADCs. On account of that some or all elements of the SDM ADCs could be known, the detail of such elements is omitted provided that such detail has little to do with the features of this disclosure, and that this omission nowhere dissatisfies the specification and enablement requirements.

Figure 1:
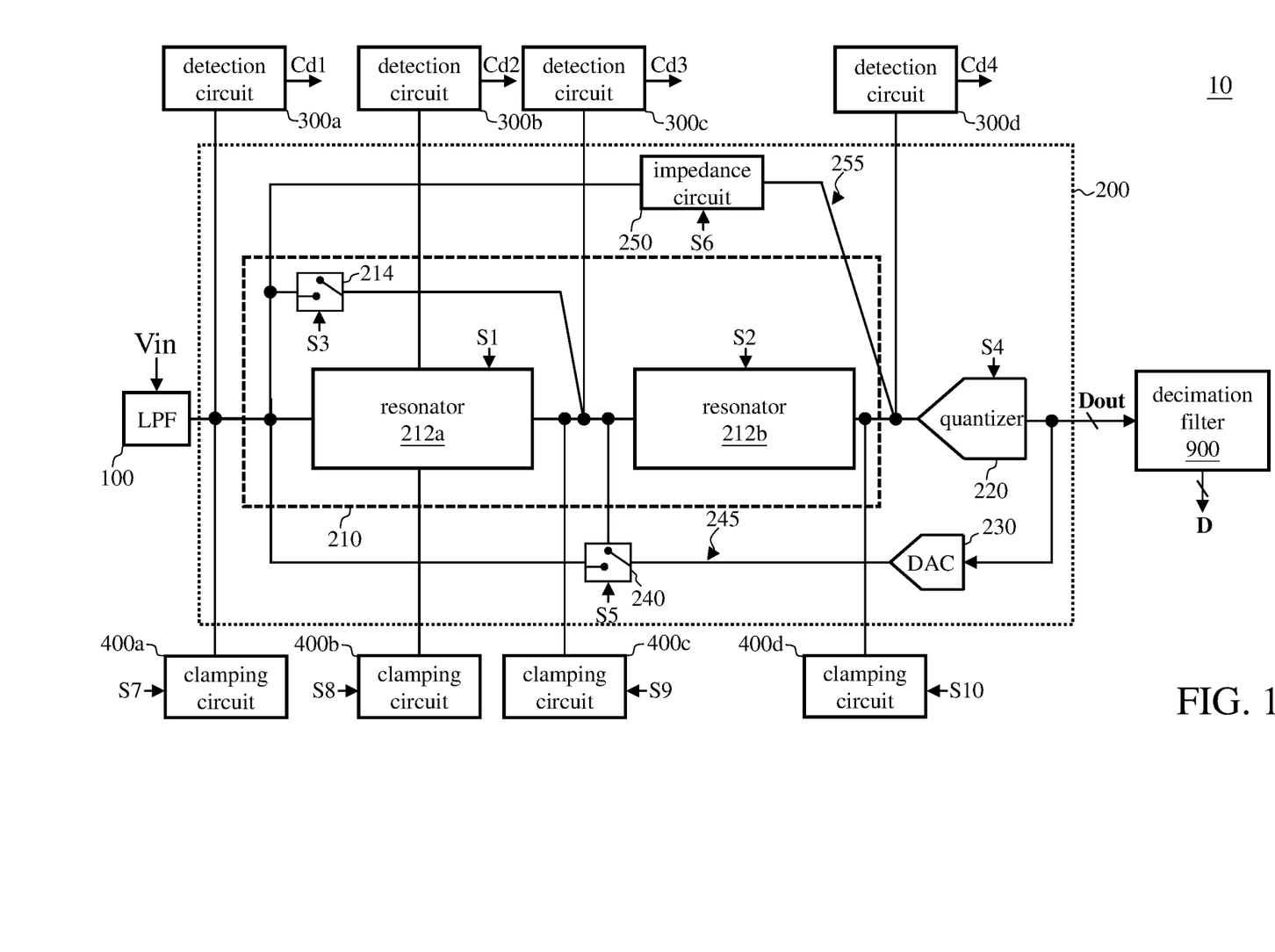
FIG. 1 illustrates a circuit diagram of an ADC according to an embodiment of the invention.

FIG. 1 illustrates a circuit diagram of an ADC according to an embodiment of the invention. The ADC 10 is an SDM ADC which includes a low-pass filter (LPF) 100, an SDM 200, a decimation filter 900, multiple detection circuits 300 (including detection circuits 300a, 300b, 300c and 300d in the example circuit of FIG. 1) and multiple clamping circuits 400 (including clamping circuits 400a, 400b, 400c and 400d in the example circuit of FIG. 1). The LPF 100 low-pass filters the analog input signal Vin, and the SDM 200 converts the low-pass filtered analog input signal Vin into a digital output signal Dout, which is in turn processed by the decimation filter 900 to a generate digital code D. The digital code D is the output of the ADC 10. The operation of the decimation filter 900 is well known to people having ordinary skill in the art, and the details are thus omitted for brevity.

The SDM 200 includes a loop filter 210, a quantizer 220, a digital-to-analog converter (DAC) 230, a switch 240 and an impedance circuit 250. The loop filter 210, which includes a resonator 212a, a resonator 212b and a switch 214, receives and filters the low-pass filtered analog input signal Vin. The quantizer 220 is coupled to the loop filter 210 and configured to quantize the output of the loop filter 210 to generate the digital output signal Dout. The switch 240 is coupled between the DAC 230 and the loop filter 210. The operation of the SDM 200 is well known to people having ordinary skill in the art, and the details are thus omitted for brevity. The order of the loop filter 210 in FIG. 1 is intended to illustrate the invention by way of examples, rather than to limit the scope of the claimed invention.

The resonator 212a is controlled by the control signal S1. The resonator 212b is controlled by the control signal S2. The switch 214 is controlled by the control signal S3. The quantizer 220 is controlled by the control signal S4. The switch 240 is controlled by the control signal S5. The impedance circuit 250 is controlled by the control signal S6. The clamping circuits 400a through 400d are controlled by the control signals S7 through S10, respectively.

The detection circuits 300 detect several node voltages of the SDM 200 and generate the control signals Cdx accordingly (for the example circuit of FIG. 1, x is an integer and 1≤x≤4). More specifically, the detection circuit 300a detects the voltage of the input terminal of the SDM 200 (i.e., the output terminal of the low-pass filter 100 and the input terminal of the resonator 212a) and generates the control signal Cd1. The detection circuit 300b detects the voltage of an internal node of the resonator 212a and generates the control signal Cd2. The detection circuit 300c detects the output voltage of the resonator 212a (i.e., the input voltage of the resonator 212b) and generates the control signal Cd3. The detection circuit 300d detects the output voltage of the resonator 212b (i.e., the input voltage of the quantizer 220) and generates the control signal Cd4. The control signals Cdx can be utilized to control the following circuit components: (1) the loop filter 210; (2) the quantizer 220; (3) the feedback path 245 of the SDM 200; (4) the feedforward path 255 of the SDM 200; and (5) the clamping circuits 400. These control cases are to be discussed in detail as follows.

Figure 2:
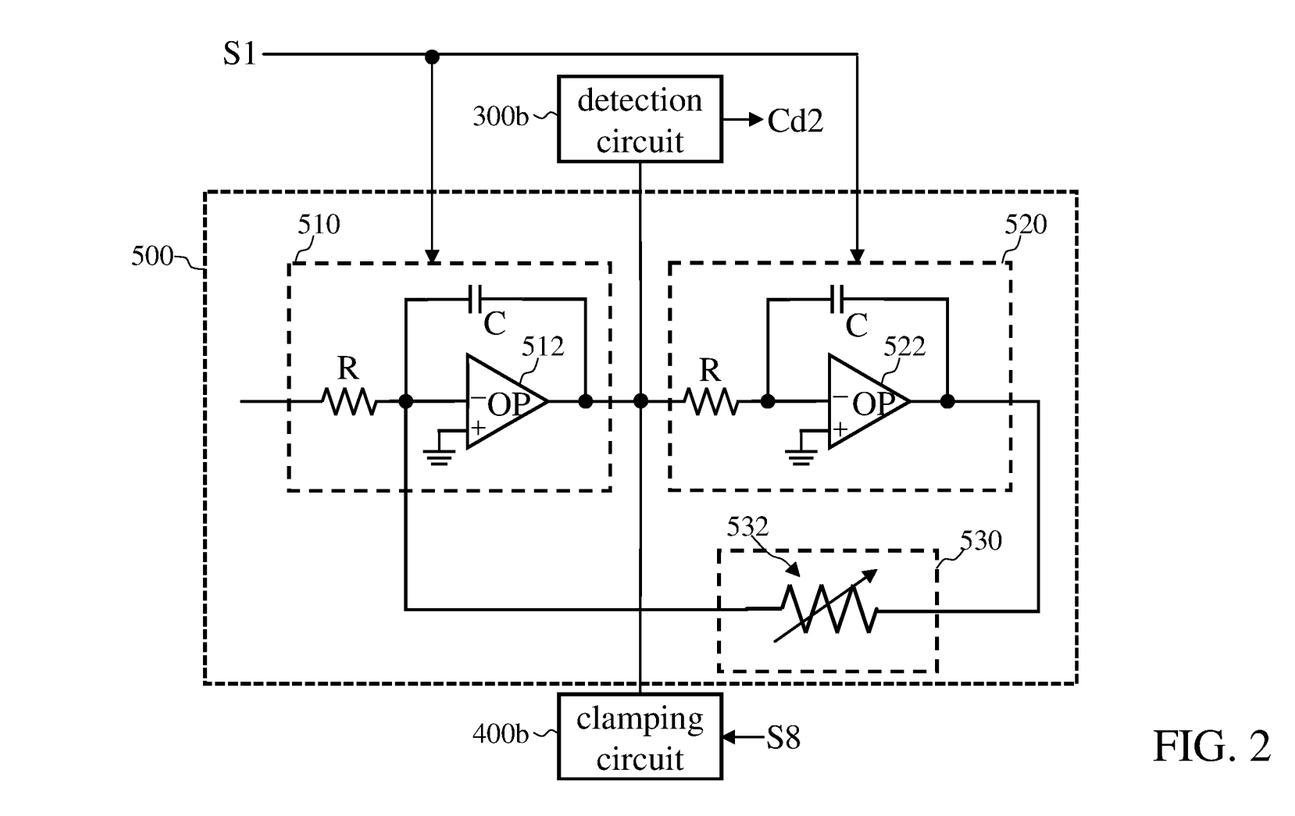
FIG. 2 illustrates a circuit diagram of a resonator according to an embodiment of the invention.

Case (1): The control signals Cdx control the loop filter 210. Reference is made to FIG. 2, which is a circuit diagram of a resonator 500 according to an embodiment of the invention. The resonator 500 includes an integrator 510, an integrator 520 and an impedance 530. The resonator 212a and the resonator 212b of FIG. 1 can be implemented with the resonator 500. The integrator 510 and the integrator 520 each include a resistor R, a capacitor C and an operational amplifier 512 or 522. These components are connected in a way as shown in FIG. 2. The operations of the integrators 510 and 520 are well known to people having ordinary skill in the art, and the details are thus omitted for brevity. The impedance 530 is located on the feedback path of the resonator 500. One end of the impedance 530 is coupled to the output terminal of the operational amplifier 522 of the integrator 520, and the other end is coupled to one of the input terminals of the operational amplifier 512 of the integrator 510. The impedance 530 includes a variable resistor 532. Controlled by the control signal S1, the integrator 510 and/or the integrator 520 can operate in a passive mode. More specifically, the control signal S1 can turn off the operational amplifier 512 and/or operational amplifier 522 so that only the passive components (i.e., the resistor R and the capacitor C) remain in the integrator 510 and integrator 520. When the image or blocker in SDM 200 is too large, turning off the operational amplifier 512 and/or operational amplifier 522 helps to stabilize the circuit. In addition, turning off the operational amplifier 512 and/or operational amplifier 522 also has the benefit of power saving.

Reference is made to FIG. 1, the control signals Cdx can also decrease the order of the loop filter 210. More specifically, when the control signal S3 controls the switch 214 to turn on, the resonator 212a is bypassed, which is equivalent to decreasing the order of the loop filter 210 by two orders. Bypassing the resonator 212a is equivalent to controlling the resonator 212a to be inactive (i.e., to inactivate the resonator 212a). When the image or blocker in SDM 200 is too large, decreasing the order of the loop filter 210 helps to stabilize the circuit. In addition, decreasing the order of the loop filter 210 also has the benefit of power saving.

Case (2): The control signals Cdx control the full swing range of an input signal to the quantizer 220. More specifically, the detection circuit 300c measures the output swing of the resonator 212a and accordingly turns on/off the comparator(s) in the quantizer 220 or adjusts the binary search cycle(s) of the quantizer 220. For example, when the output swing of the resonator 212a measured by the detection circuit 300c is less than the first preset value (implying that the most significant bit (MSB) of the digital output signal Dout may be logic 0) or greater than the second preset value, which is greater than the first preset value, (implying that the MSB of the digital output signal Dout may be logic 1), the control signal S4 turns off the comparator(s) in the quantizer 220 which correspond(s) to the higher bit(s), or controls the quantizer 220 to skip the first one or more cycle(s) of the binary search which correspond(s) to the higher bit(s). In other words, the full swing range of an input signal to the quantizer 220 may be the number of active comparators or the number of the binary search cycles performed.

Case (3): The control signals Cdx control the switch 240 to couple the output terminal of the DAC 230 to the input terminal of the resonator 212a or the input terminal of the resonator 212b. When the resonator 212a is bypassed, the control signals Cdx can accordingly control the switch 240 to couple the output terminal of the DAC 230 to the input terminal of the resonator 212b. When the resonator 212a is not bypassed, the control signals Cdx can control the switch 240 to couple the output terminal of the DAC 230 to the input terminal of the resonator 212a or the input terminal of the resonator 212b.

Case (4): The control signals Cdx control the impedance circuit 250. The feedforward path 255 connects the input terminal of the loop filter 210 with the output terminal of the loop filter 210 and includes an impedance circuit 250. The impedance of the impedance circuit 250 is adjustable (e.g., the impedance circuit 250 includes a variable resistor and/or variable capacitor), and the control signal S6 adjusts the feedforwarding of the SDM 200 by adjusting the equivalent impedance of the impedance circuit 250.

Case (5): The control signals Cdx adjust the magnitudes of the clamping voltages of the clamping circuits 400 to limit the voltage values of the corresponding nodes, thereby suppressing image or blocker to make the circuit more stable.

Reference is made to FIG. 2, the detection circuit 300b, coupled to the output terminal of the integrator 510 and the input terminal of the integrator 520, detects the voltage of the node inside the resonator 500 to generate the control signal Cd2. The clamping circuit 400b, coupled to the output terminal of the integrator 510 and the input terminal of the integrator 520, limits the voltage of the node at the output terminal of the integrator 510 and the input terminal of the integrator 520. Please note that for reason of simplicity and clarity, FIG. 1 does not show the detection circuit(s) 300 and the clamping circuit 400(s) that are electrically connected to the node(s) inside the resonator 212b. However, people having ordinary skill in the art can implement the detection circuit 300 and the clamping circuit 400 by referring to FIGS. 1 and 2.

In some embodiments, the aforementioned control signal Cdx controls the component(s) electrically connected to the detection circuit 300 that generates that same control signal Cdx. More specifically, the control signal S1 can be the control signal Cd1, control signal Cd2 or control signal Cd3; the control signal S2 can be the control signal Cd3 or control signal Cd4; the control signal S3 can be the control signal Cd1 or control signal Cd2; the control signal S4 can be the control signal Cd4; the control signal S7 can be the control signal Cd1; the control signal S8 can be the control signal Cd2; the control signal S9 can be the control signal Cd3; and the control signal S10 can be the control signal Cd4. In addition, the control signal S5 can be the same as the control signal S3, and the control signal S6 can be any control signal Cdx.

In other embodiments, any of the control signals S1 through S10 can be any of the control signals Cd1 through Cd4.

Figure 3:
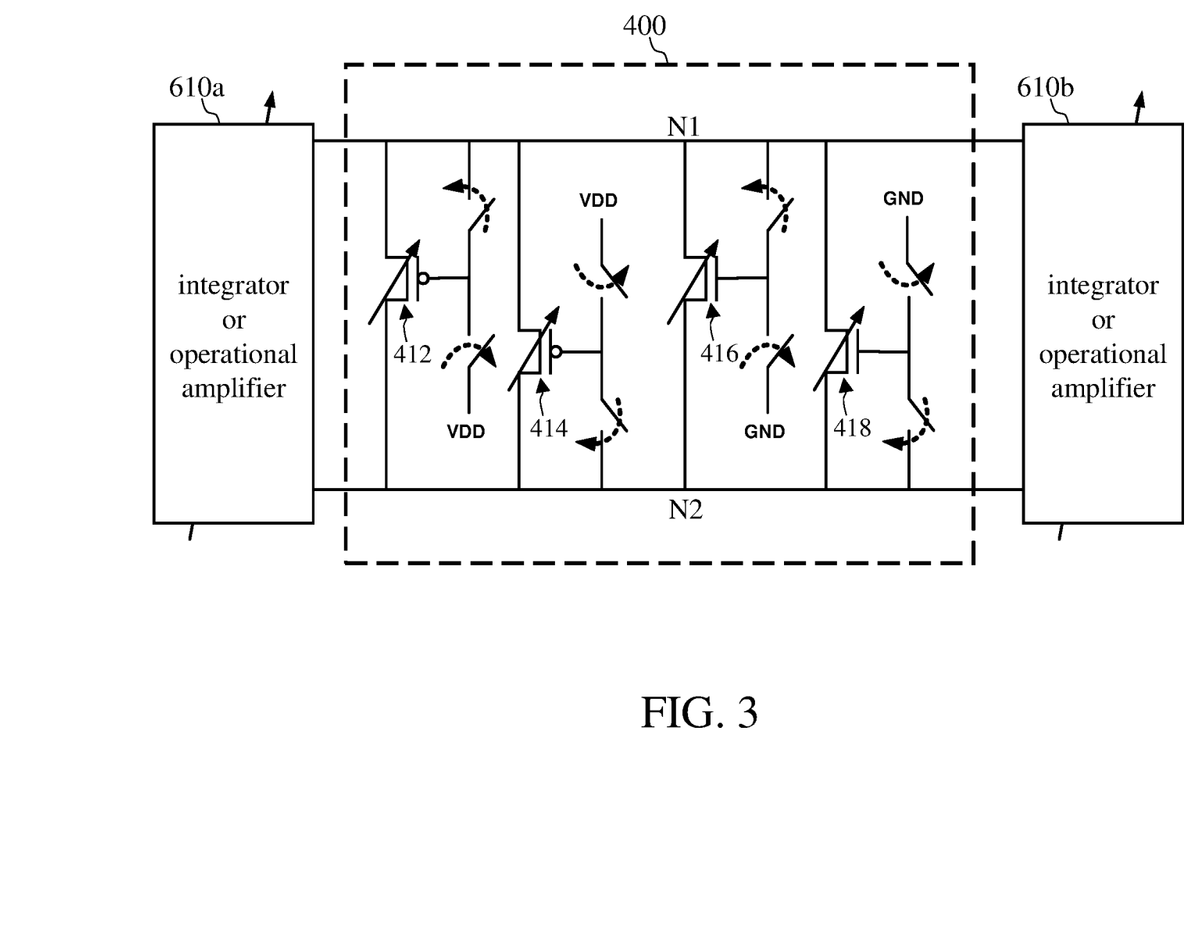
FIG. 3 illustrates a circuit diagram of a clamping circuit according to an embodiment of the present invention.

FIG. 3 is a circuit diagram of a clamping circuit 400 according to an embodiment of the present invention. The clamping circuit 400 mainly includes a transistor 412, transistor 414, transistor 416, transistor 418 and multiple switches. The clamping voltage of the clamping circuit 400 (i.e., the voltage difference between the node N1 and the node N2) can be adjusted by switching these switches. Node N1 and node N2 are electrically connected to the output terminals of the integrator or operational amplifier 610a and integrator or operational amplifier 610b, so the output voltages of the integrator or operational amplifier 610a and integrator or operational amplifier 610b are limited to the clamping voltage of the clamping circuit 400. The number of transistors and the number of switches of the clamping circuit 400 are intended to illustrate the invention by way of examples, rather than to limit the scope of the claimed invention. The operation of the clamping circuit 400 is well known to people having ordinary skill in the art, and the details are thus omitted for brevity. Similar to the integrators 510 and 520, the integrator or operational amplifiers 610a and 610b can be controlled to operate in the passive mode.

Figure 4:
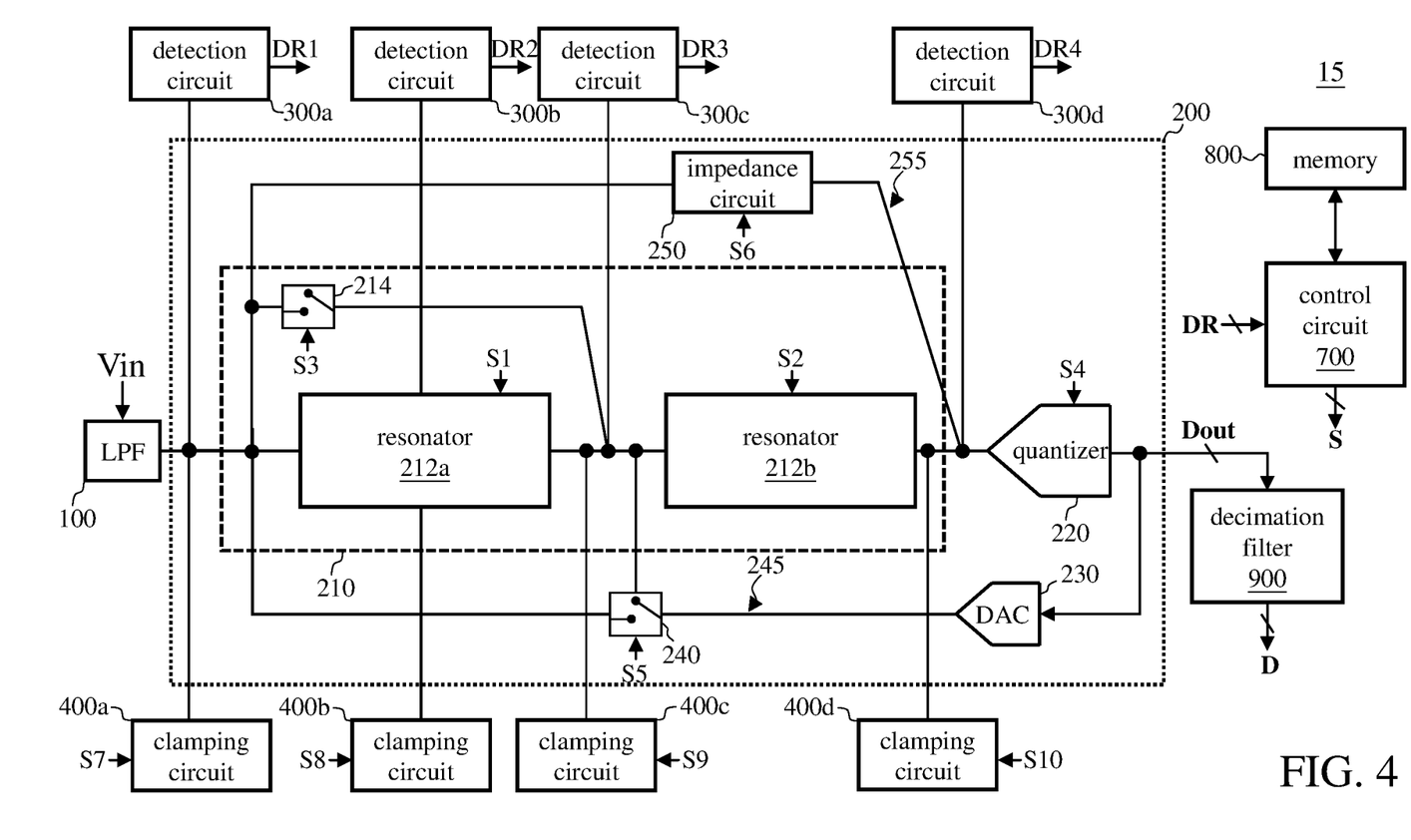
FIG. 4 illustrates a circuit diagram of an ADC according to another embodiment of the invention.

FIG. 4 illustrates a circuit diagram of an ADC according to another embodiment of the invention. The embodiment of FIG. 4 is similar to the embodiment of FIG. 1, except that the ADC 15 of FIG. 4 further includes a control circuit 700 and a memory 800. In the embodiment of FIG. 4, the control signals S (including S1 through S10) are generated by the control circuit 700 according to the detection results DR (including DR1 through DR4) of the detection circuits 300, rather than being directly generated by the detection circuits 300. More specifically, the control circuit 700 may be circuits or electronic components with program execution capability, such as a central processing unit (CPU), microprocessor, micro processing unit or digital signal processor. The control circuit 700 executes the program codes or program instructions stored in the memory 800 to conduct control. In some embodiments, the memory 800 stores a look-up table, and the control circuit 700 searches the look-up table for the control mode corresponding to the detection results DR. As a result, the image or blocker in the SDM 200 can be suppressed, and the power consumption can be reduced.

Unlike the ADC 10 of FIG. 1, the ADC 15 of FIG. 4 concurrently takes the voltages of multiple nodes of the SDM 200 into consideration. Therefore, the ADC 15 performs the control in a comprehensive way by considering the various cases discussed above all together, thereby achieving a better or optimal combination of the following multiple circuit characteristics: the order of the loop filter 210, coefficients of signal transfer function (STF) and/or noise transfer function (NTF), swing, the clamping voltages of the clamping circuits 400, maximum signal-to-noise ratio (SNR), maximum dynamic range, maximum error vector magnitude (EVM), maximum swing stability, maximum blocker (co-existence) ability, and minimum power consumption. The embodiment of FIG. 1 has a shorter response time (i.e., the circuit can be adjusted faster), whereas the embodiment of FIG. 4 has a more comprehensive and diverse adjustment strategy. Alternatively, the control circuit 700 of FIG. 4 can perform separate adjustment for any of the multiple cases mentioned above, in which case at least one of the control signals S1 through S10 is independent from other control signals.

Figure 5:
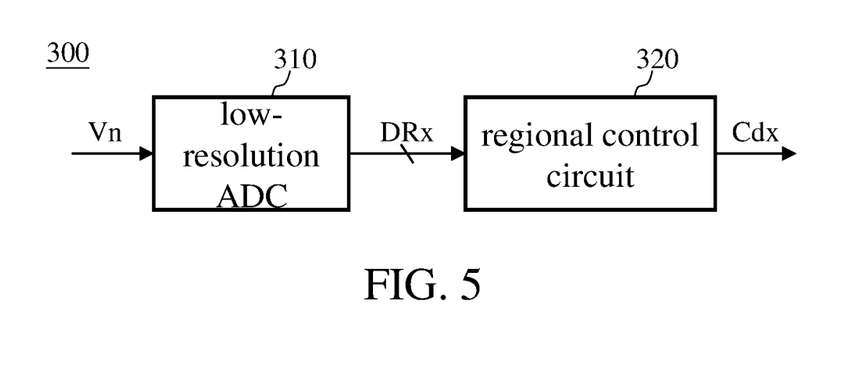
FIG. 5 illustrates a functional block diagram of a detection circuit according to an embodiment of the present invention.

FIG. 5 is a functional block diagram of the detection circuit 300 according to an embodiment of the present invention. The detection circuit 300 includes a low-resolution ADC 310 and a regional control circuit 320. The low-resolution ADC 310 converts the node voltage Vn into the detection result DRx (for the example circuit of FIG. 4, x is an integer and 1≤x≤4), and the regional control circuit 320 then generates the control signal Cdx according to the detection result DRx. The low-resolution ADC 310 has fewer bits than the ADC 10 and ADC 15. For example, the low-resolution ADC 310 can be implemented with a 2-bit ADC so that the detection result DRx can be obtained quickly. The regional control circuit 320 may be a logic circuit containing multiple transistors. People having ordinary skill in the art can implement the regional control circuit 320 based on the above discussions. When the detection circuit 300 of FIG. 5 is applied to the embodiment of FIG. 4, the detection circuit 300 includes the low-resolution ADC 310 but does not include the regional control circuit 320. The larger the node voltage Vn (e.g., the swing of the node is large due to the image or blocker), the larger the detection result DRx.

Figure 6:
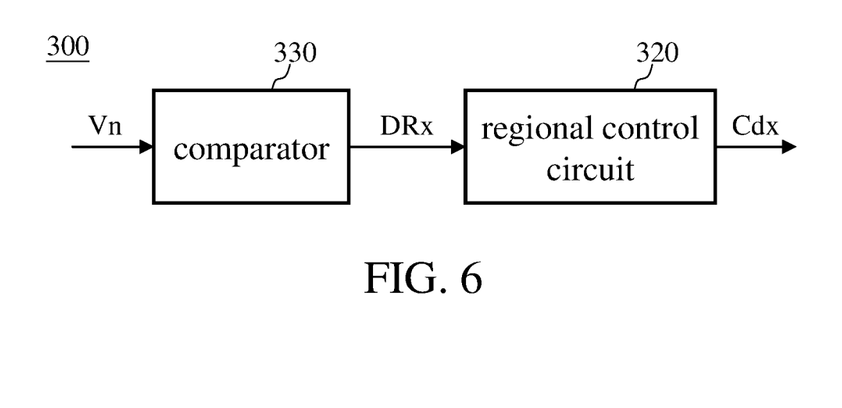
FIG. 6 illustrates a functional block diagram of a detection circuit according to another embodiment of the present invention.

FIG. 6 is a functional block diagram of the detection circuit 300 according to another embodiment of the present invention. The detection circuit 300 includes a comparator 330 and a regional control circuit 320. The comparator 330 compares the node voltage Vn with a preset voltage to generate a detection result DRx, and the regional control circuit 320 then generates the control signal Cdx according to the detection result DRx. The comparator 330 can be regarded as a one-bit low-resolution ADC 310. When the detection circuit 300 of FIG. 6 is applied to the embodiment of FIG. 4, the detection circuit 300 includes the comparator 330 but does not include the regional control circuit 320.

In summary, the ADC of the present invention uses one or more detection circuits to detect the node voltage(s) of the SDM and adaptively adjusts the ADC according to the detection result(s) to improve the stability of the ADC and reduce power consumption.

The shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An analog-to-digital converter (ADC) configured to receive an analog input signal and generate a digital code, comprising:
    a sigma-delta modulator (SDM), comprising:
        a loop filter configured to receive the analog input signal;
        a quantizer, coupled to the loop filter and configured to quantize an output of the loop filter to generate a digital output signal; and
        a digital-to-analog converter (DAC), coupled to the quantizer and the loop filter;
    a decimation filter, coupled to the SDM and configured to convert the digital output signal to the digital code; and
    a detection circuit, coupled to the SDM and configured to detect a node voltage of the SDM and generate a control signal;
    wherein the control signal is utilized to control the loop filter and/or the quantizer.

2. The ADC of claim 1, wherein the loop filter comprises a resonator, the resonator comprises an operational amplifier, and the control signal is utilized to turn off the operational amplifier.

3. The ADC of claim 1, wherein the loop filter comprises a resonator, and the control signal is utilized to control the resonator to be inactive.

4. The ADC of claim 3, wherein the resonator is a first resonator, the loop filter further comprises a second resonator, an input terminal of the second resonator is coupled to an output terminal of the first resonator, the SDM further comprises a switch coupled between the loop filter and the DAC, and the control signal is utilized to control the switch in such a way that when the first resonator is inactive, an output terminal of the DAC is coupled to the input terminal of the second resonator.

5. The ADC of claim 1, wherein the loop filter comprises a first resonator and a second resonator, an input terminal of the second resonator is coupled to an output terminal of the first resonator, the SDM further comprises a switch coupled between the loop filter and the DAC, and the control signal is utilized to control the switch to accordingly control an output terminal of the DAC to be coupled to an input terminal of the first resonator or the input terminal of the second resonator.

6. The ADC of claim 1, wherein the detection circuit comprises a low-resolution ADC, and the number of bits of the low-resolution ADC is less than the number of bits of the ADC.

7. The ADC of claim 1, wherein the control signal is utilized to control a full swing range of an input signal to the quantizer.

8. The ADC of claim 1, wherein the ADC further comprises a clamping circuit coupled to the SDM, and the control signal is utilized to control a clamping voltage of the clamping circuit.

9. An analog-to-digital converter (ADC) configured to receive an analog input signal and generate a digital code, comprising:
    a sigma-delta modulator (SDM), comprising:
        a loop filter configured to receive the analog input signal;
        a quantizer, coupled to the loop filter and configured to quantize an output of the loop filter to generate a digital output signal; and
        a digital-to-analog converter (DAC), coupled to the quantizer and the loop filter;
    a decimation filter, coupled to the SDM and configured to convert the digital output signal to the digital code;
    a detection circuit, coupled to the SDM and configured to detect a node voltage of the SDM and generate a detection result; and
    a control circuit, coupled to the detection circuit and configured to generate a control signal according to the detection result;
    wherein the control signal is utilized to control the loop filter and/or the quantizer.

10. The ADC of claim 9, wherein the detection circuit is a low-resolution ADC, and the number of bits of the low-resolution ADC is less than the number of bits of the ADC.

11. The ADC of claim 9, wherein the loop filter comprises a resonator, the resonator comprises an operational amplifier, and the control signal is utilized to turn off the operational amplifier.

12. The ADC of claim 9, wherein the loop filter comprises a resonator, and the control signal is utilized to control the resonator to be inactive.

13. The ADC of claim 12, wherein the resonator is a first resonator, the loop filter further comprises a second resonator, an input terminal of the second resonator is coupled to an output terminal of the first resonator, the SDM further comprises a switch coupled between the loop filter and the DAC, and the control signal is utilized to control the switch in such a way that when the first resonator is inactive, an output terminal of the DAC is coupled to the input terminal of the second resonator.

14. The ADC of claim 9, wherein the loop filter comprises a first resonator and a second resonator, an input terminal of the second resonator is coupled to an output terminal of the first resonator, the SDM further comprises a switch coupled between the loop filter and the DAC, and the control signal is utilized to control the switch to accordingly control an output terminal of the DAC to be coupled to an input terminal of the first resonator or the input terminal of the second resonator.

15. The ADC of claim 9, wherein the ADC further comprises a clamping circuit coupled to the SDM, and the control signal is utilized to control a clamping voltage of the clamping circuit.

16. The ADC of claim 9, wherein the control signal is utilized to control a full swing range of an input signal to the quantizer.

* * * * *